United States Patent
Ritz et al.

(10) Patent No.: US 10,594,098 B2
(45) Date of Patent: Mar. 17, 2020

(54) CONNECTION UNIT FOR AN ELECTRICAL DEVICE, ELECTRICAL DEVICE SYSTEM, AND PRODUCTION METHOD

(71) Applicant: SEW-EURODRIVE GMBH & CO. KG, Bruchsal (DE)

(72) Inventors: Stefanie Ritz, Wiesloch (DE); Jürgen Ott, Dettenheim (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 15/771,368

(22) PCT Filed: Oct. 12, 2016

(86) PCT No.: PCT/EP2016/025113
§ 371 (c)(1),
(2) Date: Apr. 27, 2018

(87) PCT Pub. No.: WO2017/071815
PCT Pub. Date: May 4, 2017

(65) Prior Publication Data
US 2018/0316148 A1  Nov. 1, 2018

(30) Foreign Application Priority Data
Oct. 27, 2015 (DE) .................. 10 2015 013 902

(51) Int. Cl.
*H01R 25/00* (2006.01)
*H01R 31/06* (2006.01)
(Continued)

(52) U.S. Cl.
CPC ............ *H01R 31/06* (2013.01); *H01R 9/226* (2013.01); *H01R 9/2408* (2013.01); *H01R 31/02* (2013.01); *H01R 31/085* (2013.01); *H01R 43/20* (2013.01)

(58) Field of Classification Search
CPC ...... H01R 9/226; H01R 9/2408; H01R 31/06; H01R 31/02; H01R 31/085; H01R 43/20
(Continued)

(56) References Cited

U.S. PATENT DOCUMENTS 8,647,159 B2 * 2/2014 Steeves .................. H01R 4/305
439/798
8,801,475 B2 * 8/2014 Maninchedda .......... H01R 4/36
439/814

(Continued)

FOREIGN PATENT DOCUMENTS

CN 103390667 A 11/2013
DE 19807710 A1 9/1999
(Continued)

OTHER PUBLICATIONS

International Preliminary Report on Patentability issued in international patent application No. PCT/EP2016/025113, dated May 1, 2018 (7 pages).
(Continued)

*Primary Examiner* — Khiem M Nguyen
(74) *Attorney, Agent, or Firm* — Hunton Andrews Kurth LLP

(57) ABSTRACT

In a connection unit for an electrical device, an electrical device system, and a production method, the connection unit has an electrically insulating receiving part, which includes a first receiving section, a second receiving section, and at least one electrically conductive connection device, in particular a bus bar. The receiving part is arranged to accommodate connection device(s) with the aid of the first and second receiving sections. A connection device is accommodated in the first receiving section, and, for example, no connection devices are accommodated in the second receiving section.

23 Claims, 20 Drawing Sheets

(51) Int. Cl.
  *H01R 9/22*   (2006.01)
  *H01R 43/20*  (2006.01)
  *H01R 31/08*  (2006.01)
  *H01R 9/24*   (2006.01)
  *H01R 31/02*  (2006.01)

(58) Field of Classification Search
  USPC ................................................ 439/638, 709
  See application file for complete search history.

(56) References Cited

U.S. PATENT DOCUMENTS

| | | | |
|---|---|---|---|
| 9,748,673 B1 * | 8/2017 | Kitatani | ................... H01R 9/24 |
| 2014/0127932 A1 | 5/2014 | Hoppmann et al. | |
| 2015/0064989 A1 | 3/2015 | Hirasawa et al. | |

FOREIGN PATENT DOCUMENTS

| | | |
|---|---|---|
| DE | 19902745 B4 | 8/2000 |
| DE | 102007044468 A1 | 12/2008 |
| DE | 202011000835 U1 | 11/2011 |
| DE | 102011115637 B4 | 12/2012 |
| EP | 1065768 A2 | 1/2001 |
| GB | 2449950 A | 12/2018 |

OTHER PUBLICATIONS

International Search Report dated Dec. 19, 2016, in International Application No. PCT/EP2016/025113. (English-language translation).

* cited by examiner

CONNECTION UNIT FOR AN ELECTRICAL DEVICE, ELECTRICAL DEVICE SYSTEM, AND PRODUCTION METHOD

FIELD OF THE INVENTION

The present invention relates to a connection unit for an electrical device, to an electrical device system, and to a production method.

BACKGROUND INFORMATION

A converter system is described in German Published Patent Application No. 103 25 956.

SUMMARY

Example embodiments of the present invention provide a connection unit for an electrical device, an electrical device system, and a production method while improving the environmental protection.

According to an example embodiment of the present invention, a connection unit for an electrical device includes an electrically insulating receiving part, which has a first receiving section, a second receiving section, and at least one electrically conductive connection device, in particular a bus bar. The receiving part is configured to receive connection device with the aid of the first and the second receiving sections, and a connection device is accommodated in the first receiving section.

This has the advantage that the connection device is reversibly connectable to the respective receiving section. Thus, the connection unit may or may not be fitted with a connection device, depending on which connection device is required for the electrical device. The connection unit may therefore be used for a modular set for different electrical devices.

The modular set may include reusable parts for the connection unit, which reduces the number of components in the modular set and is better for the environment.

It may be provided that no connection device is accommodated in the second receiving section. This is considered advantageous because identically configured connection parts may be used for different configurations of the connection units. Depending on the arrangement of the connection units, connection device(s) are accommodated or not accommodated in the receiving sections.

The first receiving sections may be set apart from one another in each case, the second receiving sections may be set apart from one another, and the first receiving sections and the second receiving sections may be set apart from each other in each case. This has the advantage that the receiving part, which is arranged to be electrically insulating, may be used as insulating device for the connection device accommodated in the receiving sections.

The connection devices may be able to be set apart from one another with the aid of the receiving part, in particular in an electrically insulating manner. This is considered advantageous since no additional insulating devices are required. As a result, the number of parts is able to be reduced to the benefit of the environment.

The connection device may be reversibly connected to the receiving part, in particular by form locking and/or friction locking. This has the advantage that the receiving unit is able to be adapted to the electrical device. The receiving unit may be reused for a different kind of electrical device in that the connection devices are retrofittable and/or removable.

The connection device may be connected to the receiving part with the aid of screws. This has the advantage that the connection device is able to be connected to the receiving part in a secure and reversible manner.

The connection device may connect a cable socket and/or a connector bar in an electrically conductive manner to an electrical connection element, in particular a voltage input and/or a voltage output, of the electrical device. This has the advantage that no additional cables are required for connecting the electrical device to the cable socket or the connector bar. Components are able to be saved in this manner and the stress on the environment is reduced.

The connection device may have a threaded bore, to which a screw part is able to be screw-fitted for the reversible and electrically conductive connection of the cable socket and/or the connector bar to the connection device. This has the advantage of allowing for the establishment of a safe, electrically conductive mechanical connection.

The connection unit may have a bushing, which is intermaterially connected to the receiving part, in particular extrusion-coated, and the bushing may be made from an electrically conductive material, in particular. This has the advantage that each connection unit includes the bushing. The bushing is easily able to be connected to the receiving part in a loss-proof manner.

The connection unit may have two connection devices and an insulating device that is disposed between the two connection devices, the connection devices contacting the insulating device in each case and being accommodated in the receiving part; in particular, the connection devices are disposed so as to be electrically insulated from one another with the aid of the insulating device. This is considered advantageous because the layer-type configuration of the connection devices with the insulating device makes it possible to reduce the electrical transmission resistance. This layer-type configuration acts as a filter capacitor. Oscillations or fluctuations of the voltage in the connection device are therefore able to be reduced, which also benefits the environment.

The receiving part may be arranged as a plastic part, in particular as a plastic injection-molded part. This offers the advantage of an uncomplicated production of the receiving part.

The receiving sections may be implemented in the form of recesses in the receiving part, which is considered advantageous because the receiving sections are able to be provided in an uncomplicated manner. The recesses may be able to be produced in a single working step together with the receiving part, using an injection-molding method.

The receiving device may be arranged as a sheet-metal part, in particular a punched and bent part. This has the advantage that the connection device has a large cross-section and thereby exhibits a lower electrical resistance than electrical connection cables, for example.

The connection unit may have a cover part, and the cover part may be reversibly connected to the receiving part, in particular screw-fitted with the aid of a screw part, the bus bar being delimited by the cover part and the receiving part. This has the advantage that the bus bar is able to be at least partially accommodated in the cover part. The cover part may be configured to be electrically insulating, in particular as a plastic part, so that a shockproof connection for the bus bar is provided with the aid of the cover part.

The bus bar may be at least partially situated between the cover part and the receiving part and/or may be held by the cover part and the receiving part. This has the advantage that the bus bar is reversibly connected to the receiving part with the aid of the cover part.

The cover part may have a recess through which the bus bar is at least partially guided. This has the advantage that the bus bar is able to be connected in an electrically conductive manner to a voltage input and/or a voltage output of the electrical device.

The cover part may have two recesses that are set apart from each other, and a bus bar may be at least partially guided through each recess. As a result, the bus bars are able to be electrically insulated from one another with the aid of the cover part.

According to an example embodiment of the present invention, an electrical device system includes a first electrical device and a second electrical device, connector bars and a first and a second connection unit, e.g., as described above, the first electrical device being reversibly connected to the first connection unit, in particular screw-fitted with the aid of a screw part, and the second electrical device being reversibly connected to the second connection unit, in particular screw-fitted with the aid of a screw part, and a voltage output of the first electrical device being connected in an electrically conductive manner to a voltage input of the second electrical device with the aid of the first and the second connection units and the connector bars, the first connection unit having a first receiving part and the second connection unit having a second receiving part, and the first and the second receiving part each having a first receiving section and a second receiving section for accommodating connection device(s), a respective connection device, in particular a bus bar, being accommodated in the first receiving section, the respective connection device in particular being reversibly connected to the respective receiving part, and a connection device being accommodated in the second receiving section of the first connection unit, in particular reversibly connected to the receiving part, and no connection device being accommodated in the second receiving section of the second connection unit, the first and the second receiving part being of the same type, and in particular being identical to each other.

This has the advantage that an electrical device system equipped with different types of electrical devices whose voltage inputs and/or voltage outputs are connectable to one another in an electrically conductive manner has a modular set of connection units. With the aid of the connection units, the electrical devices are able to be connected to one another and/or to an external three-phase current supply and/or to a machine to be supplied.

The modular set of connection units may include a receiving part, which is arranged in an identical fashion for all variants of the connection units. The number of components is therefore able to be reduced, which benefits the environment.

The first electrical device may be arranged as a supply module and may have a rectifier; the second electrical device may be arranged as a drive module and may have an inverter, and the voltage output of the rectifier, in particular the intermediate-circuit voltage connection, may be connected in an electrically conductive manner to two respective connection devices, in particular bus bars, of the first connection unit.

The voltage input of the inverter, in particular the intermediate-circuit voltage connection, is connected in an electrically conductive manner to two respective connection devices, in particular bus bars, of the second connection unit, one connection device of the first connection unit in each case being connected to a connection device of the second connection unit with the aid of a connector bar. This has the advantage that the electrical device system is able to be arranged as a converter system. The converter system may have a shared DC voltage intermediate circuit for all modules, in particular the supply module and drive module. The DC voltage inputs and/or the DC voltage outputs of the modules are able to be connected to one another with the aid of the connection devices of the connection units and the connector bars.

The electrical device system may have two connector bars and an insulating device disposed between the two connector bars. The connector bars contact the insulating device in each case, and the connector bars in particular are arranged so as to be electrically insulated from one another with the aid of the insulating device.

This has the advantage that the layer-type configuration of the connector bars with the insulating device makes it possible to reduce the electrical transmission resistance. This layer-type construction acts as a filter capacitor. Oscillations or fluctuations of the voltage in the connector bars are therefore able to be reduced, which is better for the environment.

The first connection unit may have three connection devices, in particular lug parts, and one phase of a three-phase current supply in each case is connected to a respective voltage input of the supply module with the aid of a respective connection device. This is considered advantageous insofar as the supply module is able to be connected to a three-phase supply with the aid of the connection unit.

The second connection unit may include three connection devices, in particular lug parts, and one phase of the three-phase alternating voltage generated by the inverter in each case may be connected to a respective voltage input of a machine, in particular an electric motor, with the aid of a respective connection device. This has the advantage that the machine is able to be supplied from the drive module. The machine may be controllable by the drive module in that a three-phase current having a predefined frequency is able to be generated by the drive module.

The receiving part may have two second receiving sections for two connection devices, in particular lug parts, and connection devices may be accommodated in the second receiving sections of the second receiving part for the electrically conductive connection to a brake resistance of the supply module. This has the advantage that the voltage in the voltage-intermediate circuit may be reduced with the aid of the brake resistance during an operation of the converter system in the generator mode, in that electrical energy is able to be converted into heat energy.

The converter system may include at least one connection part. The connection part connects the supply module and/or the drive module to a low-voltage supply in an electrically conductive manner with the aid of bushings, which are connected to the respective receiving part in a form-locking manner. This has the advantage that the modules, in particular the supply module and/or the drive module, are connectable to a low-voltage supply and/or to a signal connection for the transmission of control commands. Additional cables for the low-voltage supply and/or the signal connection are therefore able to be saved, which is better for the environment.

The respective low-voltage inputs of the supply module and the drive module may be connected to one another in an electrically conductive manner with the aid of the bushings and the connection part. This is considered advantageous since it allows for the establishment of a safe and electrically conductive connection.

According to an example embodiment of the present invention, a method is provided for producing two variants of a connection unit for electrical devices, e.g., as described above, from a modular set having the following parts: a receiving part, a cover part, which has two recesses, two bus bars, an insulating device, and at least one lug part, the receiving part having at least one first receiving section and one second receiving section for lug parts, and receiving sections, in particular recesses, for the bus bars. For production of a first variant of the connection unit, the method includes: a first method step, in which the insulating means is placed between the bus bars, in particular connected in a form-locking manner, so that the bus bars are electrically insulated from one another and a preassembled unit is formed from the bus bars and the insulating device; a second method step, in which the preassembled unit is inserted into the cover part, and a respective lug section of a bus bar of the unit is routed through a respective recess; a third method step, in which the cover part is reversibly connected to the receiving part, in particular screw-fitted with the aid of a screw part; and a fourth method step, in which the lug part is inserted into the first receiving section and is connected to the receiving part in a form-locking manner, in particular screw-fitted with the aid of a screw part.

To produce a second variant of the connection unit, a further lug part is inserted into the second receiving section in a fifth method step, in addition to the first through the fourth method steps, and is connected to the receiving part in a form-locking manner, in particular screw-fitted with the aid of a screw part.

This has the advantage that two different variants of the connection unit are able to be produced using one method by executing one more or one less method step.

The modular set may have reusable parts for the connection unit. This makes it possible to reduce the number of parts in the modular set, to the benefit of the environment.

Further features and aspects of example embodiments of the present invention are described in greater detail below with reference to the Figures.

BRIEF DESCRIPTION OF THE DRAWINGS

Figure 1:
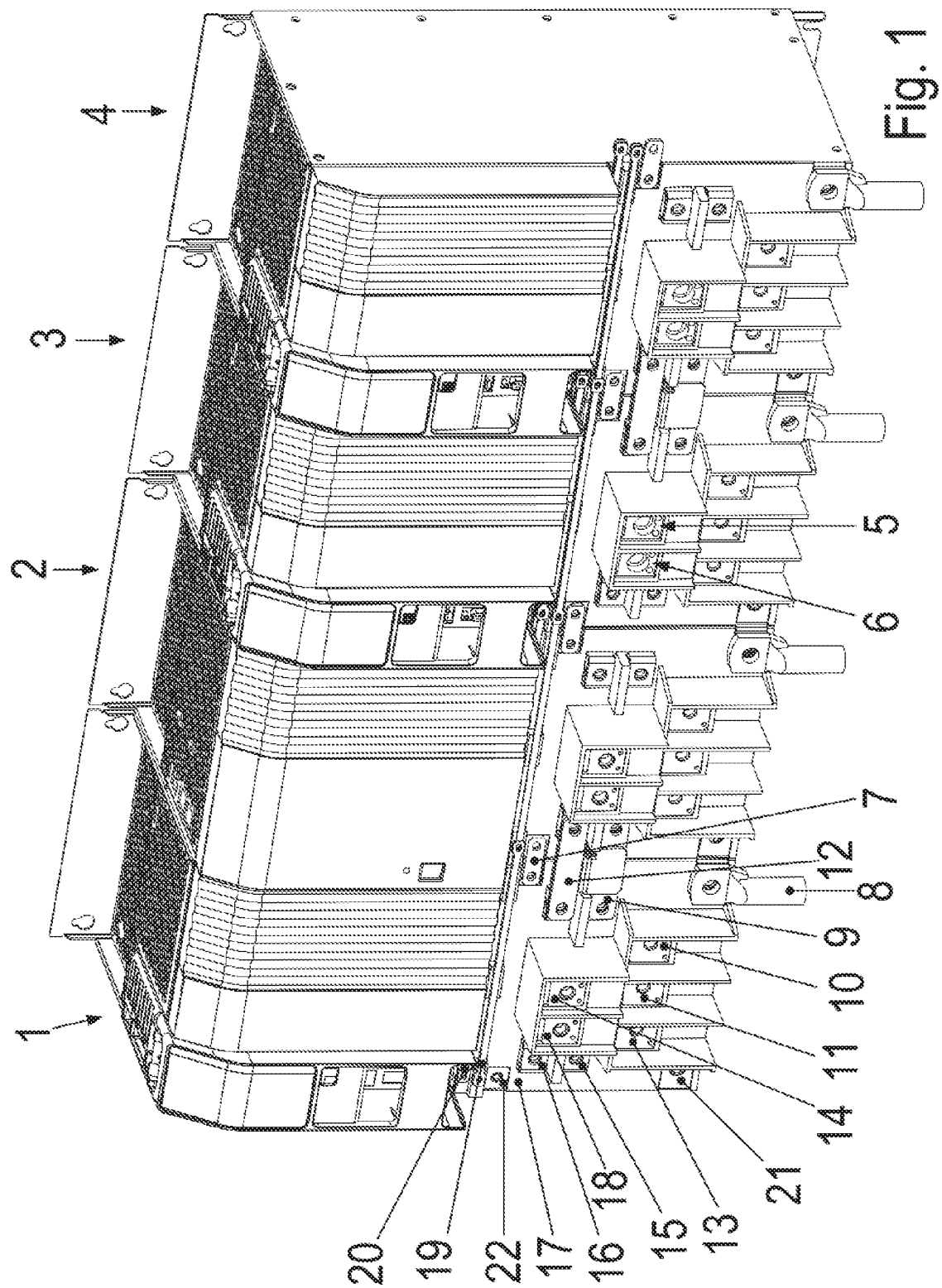
FIG. 1 shows an electrical device system according to an example embodiment of the present invention, in particular a converter system, in a perspective view.
Figure 2:
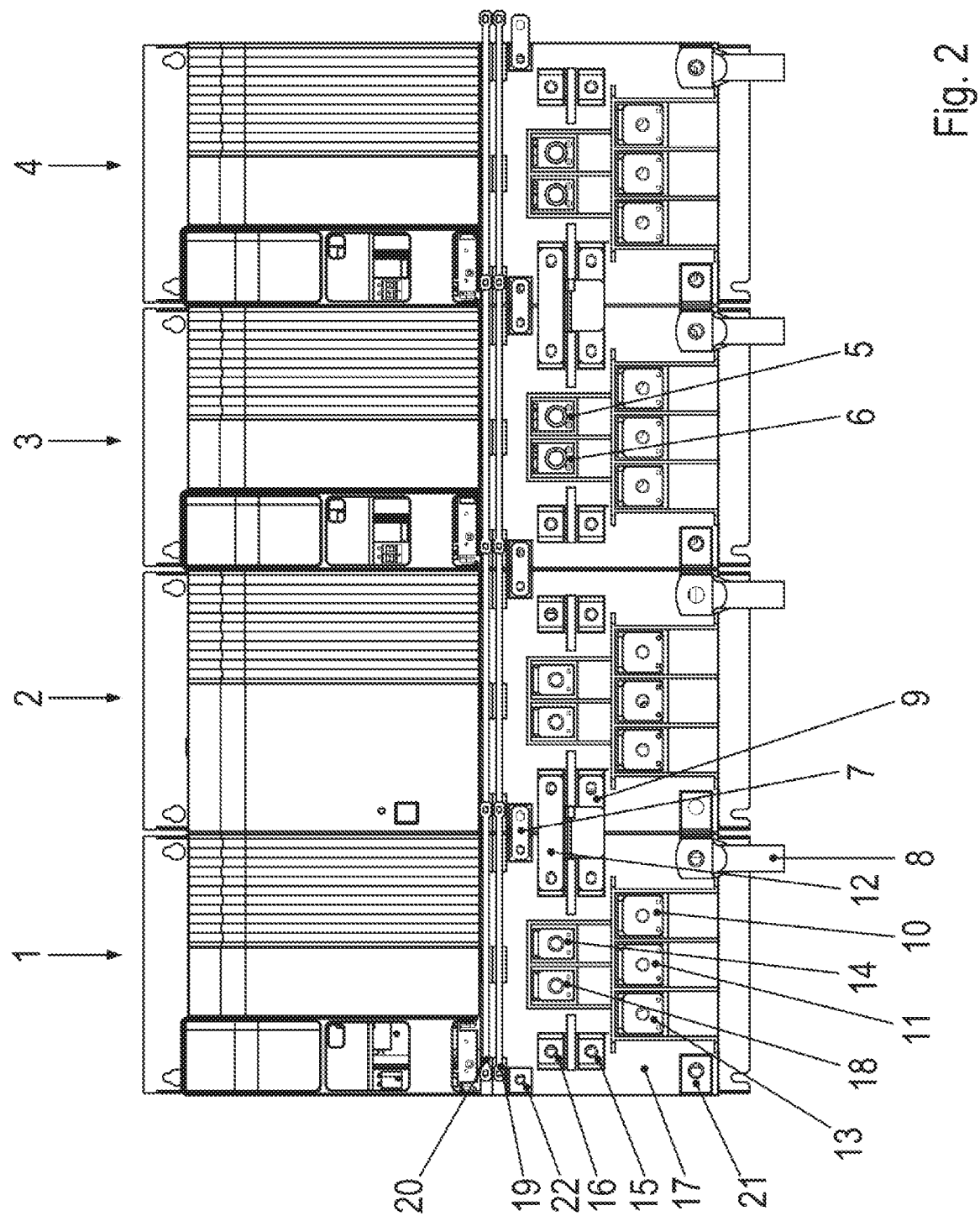
FIG. 2 shows the electrical device system in a plan view.
Figure 3:
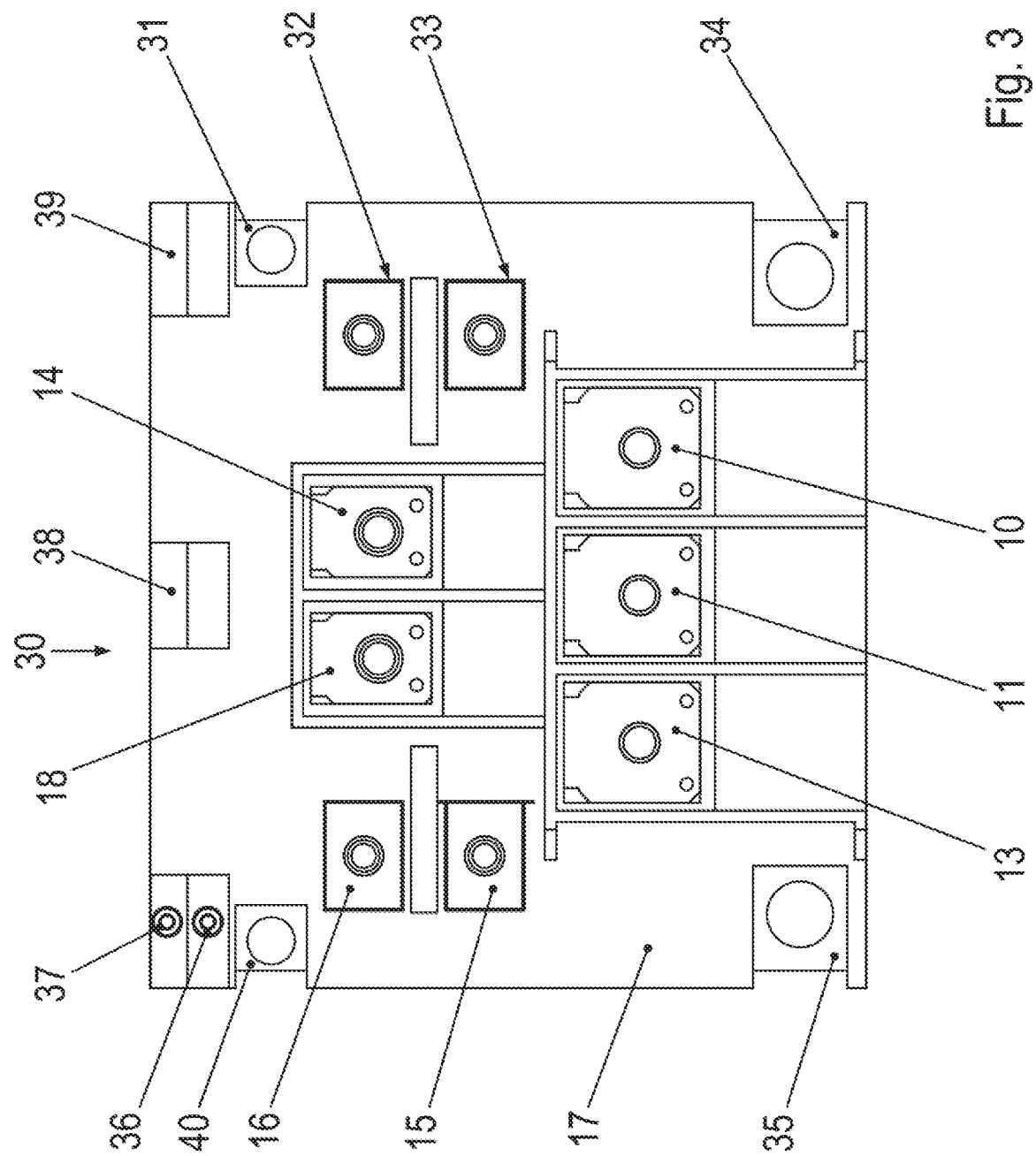
FIG. 3 shows a connection unit according to an example embodiment of the present invention in a plan view.
Figure 4:
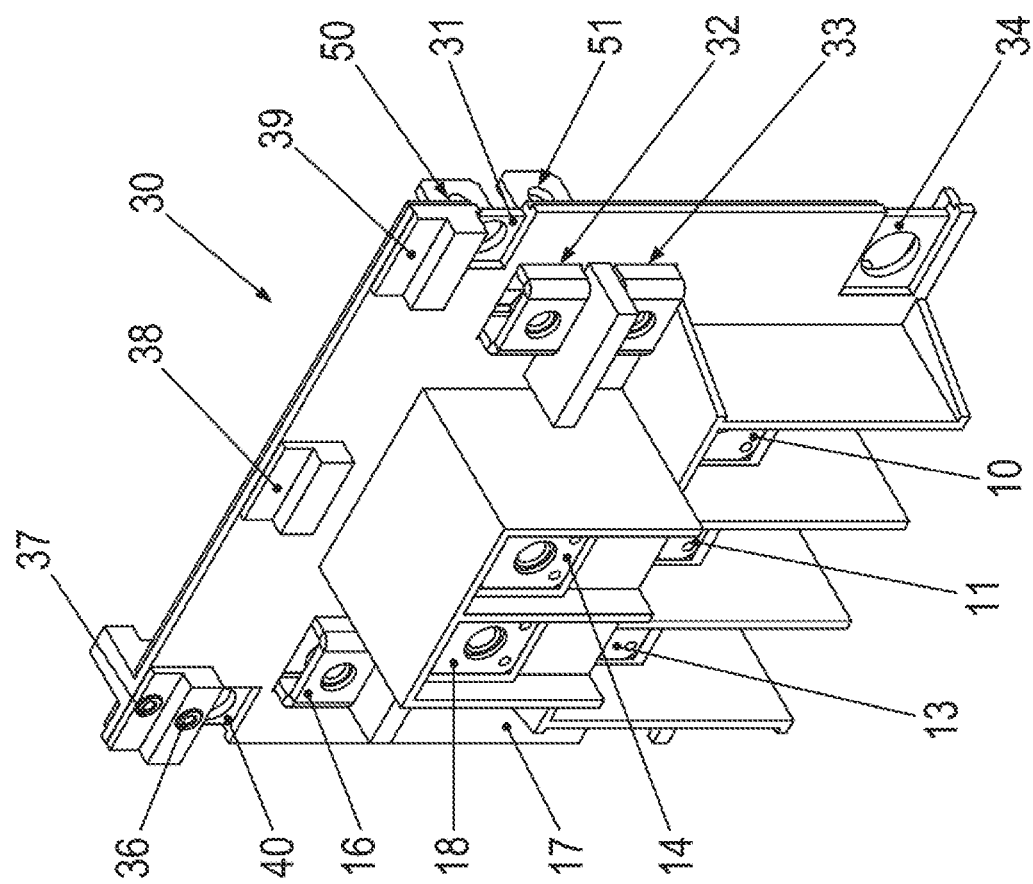
FIG. 4 shows the connection unit in a perspective view.
Figure 5:
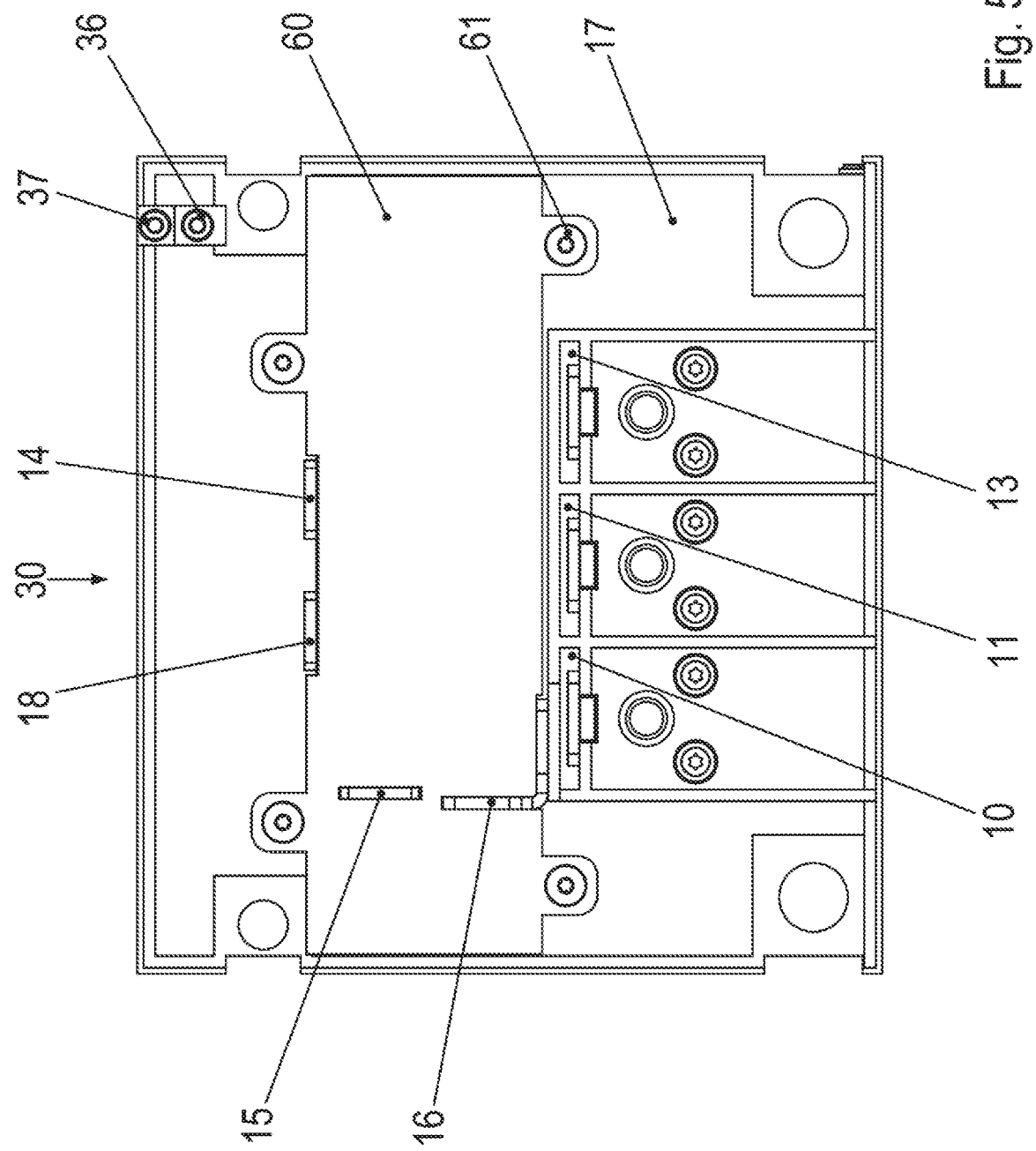
FIG. 5 shows a plan view of the backside of the connection unit.
Figure 6:
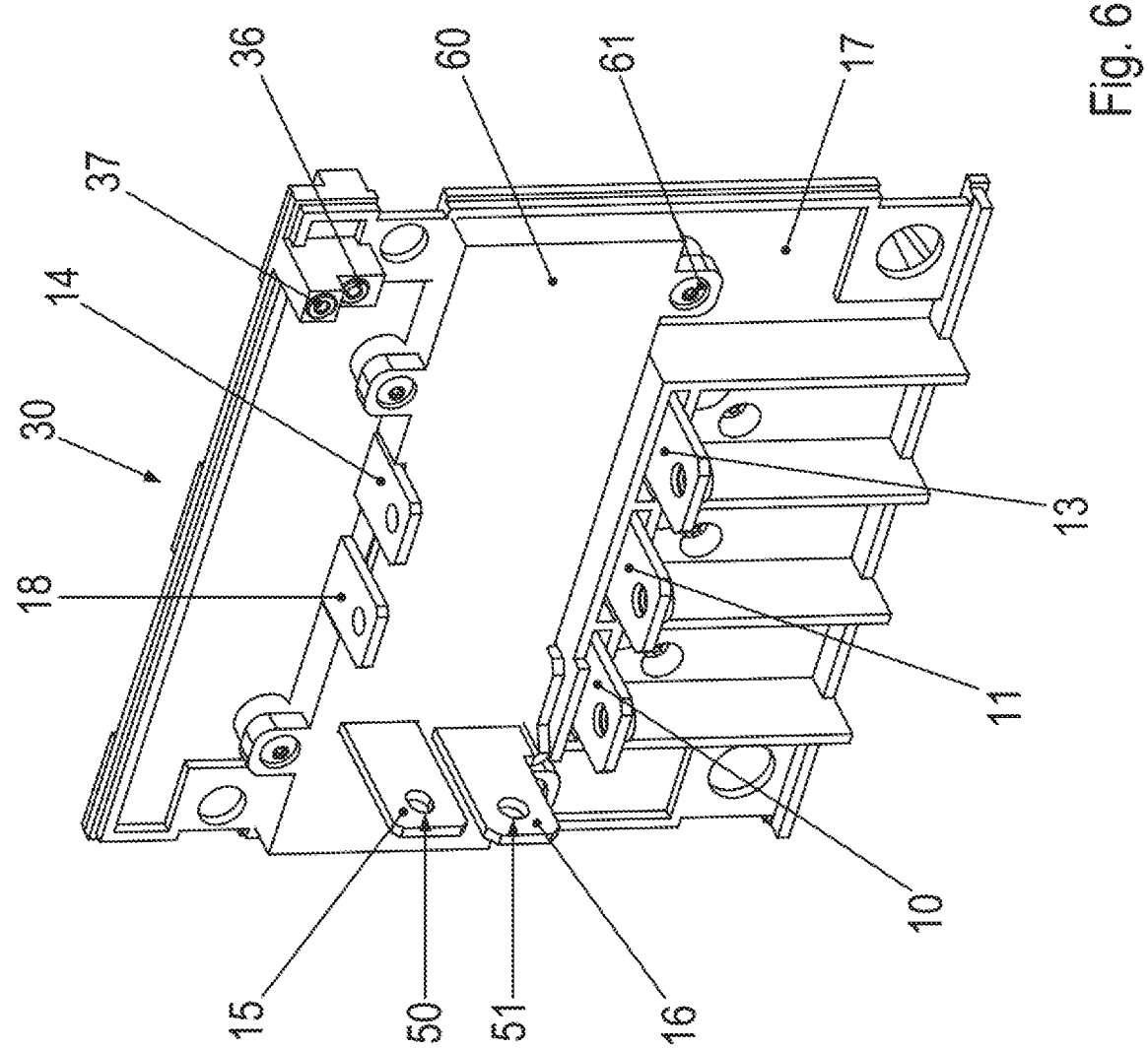
FIG. 6 shows a perspective view of the backside of the connection unit.
Figure 7:
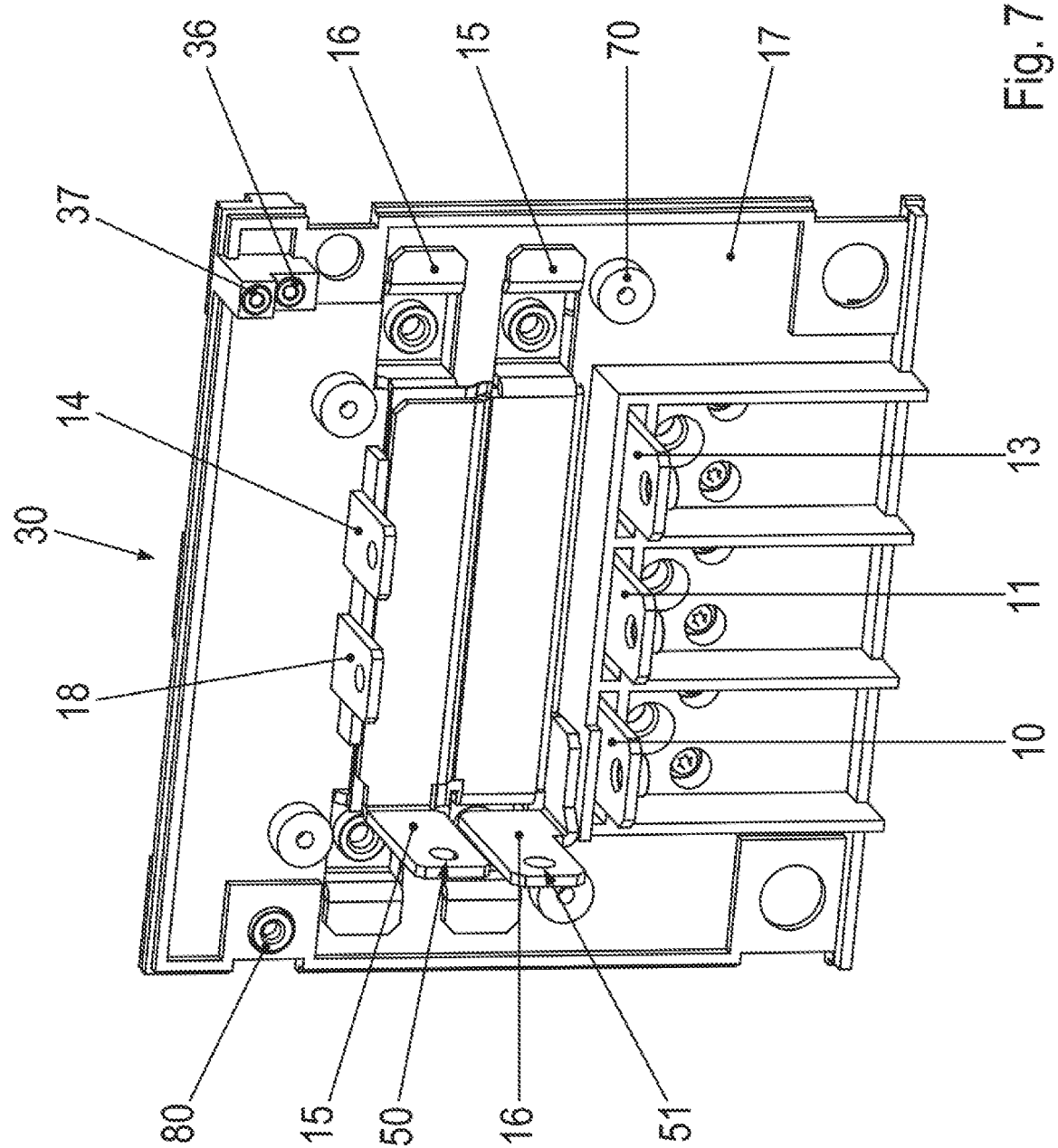
FIG. 7 shows the backside of the connection unit in an additional perspective view, in which a cover part of the connection unit has been removed.

The electrical device system, in particular the converter system, shown in FIGS. 1 and 2 has four modules or electrical devices, in particular a supply module 1 and three drive modules (2, 3, 4). Each module has a separate connection unit (30, 130).

Supply module 1 has a first connection unit 30. Each drive module (2, 3, 4) has a second connection unit 130.

Using the respective connection unit (30, 130), voltage inputs and voltage outputs of the respective modules are able to be connected to one another in an electrically conductive manner.

The modules are able to be connected to an external voltage source and/or to a machine, in particular a converter-supplied electric motor, with the aid of the respective connection unit (30, 130).

As illustrated in FIGS. 3 through 7, the connection unit (30) has an electrically insulating receiving part 17 and metallic connection devices, in particular a first and a second bus bar (15, 16) and/or lug parts (10, 11, 13, 14, 18) and/or bushings (36, 37, 80), which are provided for the connection to a cable socket and/or to a connector bar (9, 12) and/or a connection part (7, 19, 20). A cable socket and/or a bus bar (9, 12) and/or a connection part (7, 19, 20) is/are placed on and screw-fitted to the top surface of the respective metallic connection device projecting in an outward direction at the topside of connection unit 1. Each connection device has a recess (200, 210), in particular a threaded bore, for this purpose.

A correspondingly formed receiving section (5, 6, 92, 93, 94) and/or a recess (90, 91, 95, 96, 98, 99) is/are provided in receiving part 17 for each of the metallic parts.

First receiving part 17 of first connection unit 30 is arranged identically to second receiving part 17 of second connection unit 130.

The connection device in receiving part 17 are, for example, placed at a distance from one another.

Receiving part 17 is made of plastic and is, for example, produced as a plastic injection-molded part. The bushings (36, 37, 80) are intermaterially connected to receiving part 17. For example, the bushings (36, 37, 80) are extrusion-coated by receiving part 17. During the production of the plastic die casting, the bushings (36, 37, 80) are placed in a tool, whereupon the plastic is injected into the tool.

The bushings (36, 37) make it possible to connect a low-voltage supply to a low-voltage input of the respective module. Using connection parts (19, 20), which are connected, in particular reversibly connected, in an electrically conductive manner to an individual bushing (36, 37) of two connection units (30, 130), a plurality of modules of the converter system is able to be supplied with a low voltage. The connection parts (19, 20) extend along the full width of receiving part 17. The connection parts (19, 20) are supported on receiving part 17 with the aid of at least one support section (38, 39, 97).

The bus bars (15, 16) and/or lug parts (10, 11, 13, 14, 18) are connected to the receiving part (17) by form locking and/or friction locking. Connection unit 30 includes cover part 60 for this purpose. Cover part 60 is connected to receiving part 17 in a reversible manner, in particular with the aid of a screw part 61. To this end, receiving part 17 has a projection 70 in which a threaded bore is situated for the connection to screw part 61. Cover part 60 includes a tab 62 having a recess 63 through which screw part 61 is partially inserted.

Bus bars (15, 16) are delimited by cover part 60 and receiving part 17, and in particular regionally situated between cover part 60 and receiving part 17, in particular regionally accommodated in cover part 60.

Cover part 60 has a separate recess (64, 65) for each bus bar (15, 16), through which the respective bus bar (15, 16) is at least partially guided.

Cover part 60 is made from an electrically insulating material, especially plastic, in particular produced as a plastic injection-molded part.

Connection unit (30) is reversibly connected, in particular screw-fitted, to a housing part 100 of a module. Housing part 100, for example, has at least one housing-part section (21, 22) that is accommodated in a receiving section (31, 34, 35, 40) of receiving part 17. Housing part 100 is able to be grounded with the aid of a cable socket (8), which is connected to the housing-part section (21, 22).

Depending on the type of electrical device or module, such as a drive module, memory unit, supply module or return-feed unit, the connection devices, in particular the bus bars (15, 16) and/or lug parts (10, 11, 13, 14, 18), are either connected or not connected to receiving part 17. These different types of fitting with bus bars (15, 16) and/or lug parts (10, 11, 13, 14, 18) allow for the production of many variants, so that a production series is able to be produced using a small number of parts.

Figure 16:
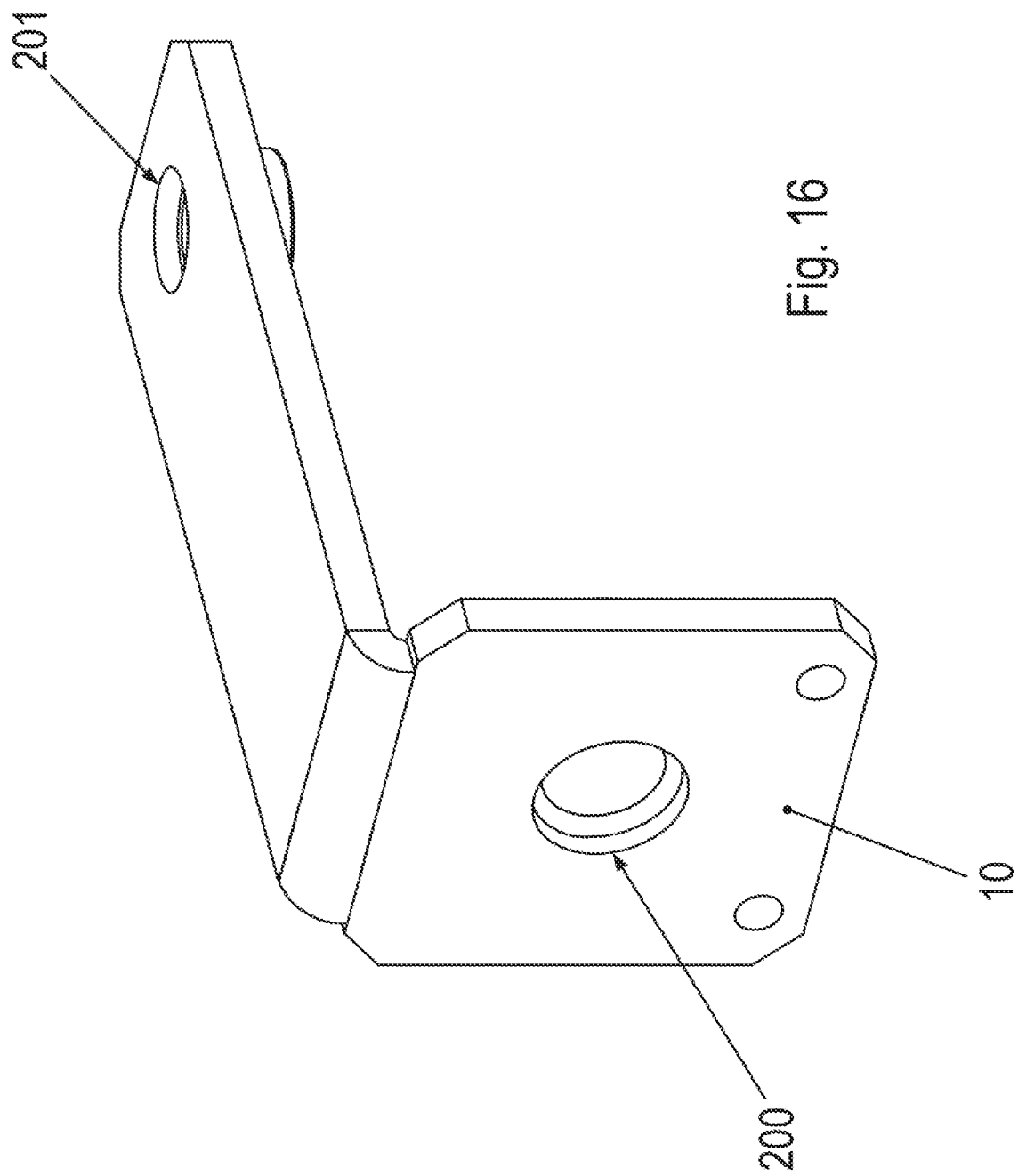
FIG. 16 shows a first lug part of the connection unit in a perspective view.
Figure 17:
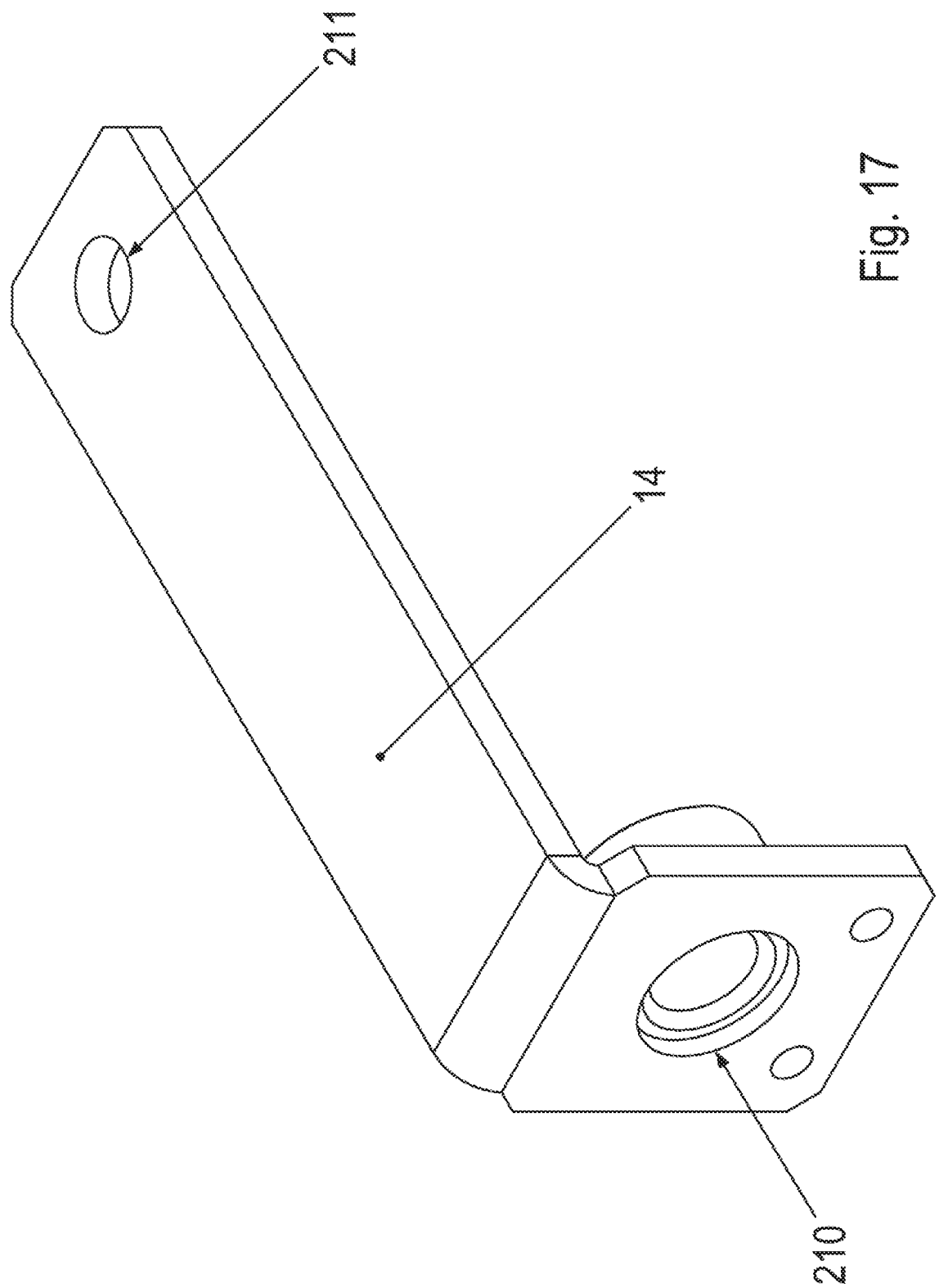
FIG. 17 shows a fourth lug part of the connection unit in a perspective view.

FIGS. 16 and 17 show the lug parts (10, 11, 12, 13, 14, 18) in detail. Each one of these lug parts (10, 11, 13, 14, 18) is implemented as an angle sheet and bent in an L-shape. The lug parts are, for example, produced as punched and bent parts.

The bent lug section of the respective lug part (10, 11, 13, 14, 18) is inserted into a recess in the respective receiving section (5, 6, 92, 93, 94) penetrating receiving part 17. Each lug part (10, 11, 13, 14, 18) is connected to receiving part 17 in a reversible manner, in particular with the aid of screws.

When the module is arranged as a supply module 1, a first, second and third lug part (10, 11, 13) are provided for a respective phase of a three-phase current supply.

Supply module 1 has a rectifier, which supplies a voltage-intermediate circuit of the converter system. Supply module 1 and the drive modules (2, 3, 4) therefore have a single shared voltage-intermediate circuit. The three phases of the three-phase current supply are routed to the rectifier.

A cable socket for each phase is, for example, situated on an electrical line of the power supply, e.g., an electrical cable. An electrical line that leads to an electrical and/or electronic circuit in supply module 1 is connected at the underside of connection unit 30. This electrical line is implemented as a cable or as a bus bar. As a result, the lug part (10, 11, 13) acts as an electrical connection element, which connects an external line of supply module 1 to an internal line of supply module 1, in particular to the input connections of the rectifier, in an electrically conductive manner.

The output connections of the rectifier are connected to bus bars (15, 16) of connection unit 30 of supply module 1 for the connection to additional modules of the converter system.

A fourth and a fifth lug part (14, 18) are provided for connecting supply module 1 to a brake resistance, in particular with the aid of a two-core connection cable. The connection cable has two cable sockets for this purpose, and a respective cable socket is connected to the fourth or fifth lug part (14, 18) in an electrically conductive manner.

In a generator-mode operation of the converter system, the voltage in the voltage-intermediate circuit is able to be reduced with the aid of the brake resistance in that electrical energy is converted into thermal energy.

Each lug part (10, 11, 13, 14, 18) includes a recess (200, 210), in particular a threaded bore, into which a screw can be screwed, so that the screw head presses the cable socket, which abuts on the outside, against the respective lug part (10, 11, 13).

In the same manner, the line abutting on the inside is screw-fitted to the bent lug section of the respective lug part (10, 11, 13) with the aid of a recess (201, 211) in the lug section, in particular a threaded bore.

Figure 8:
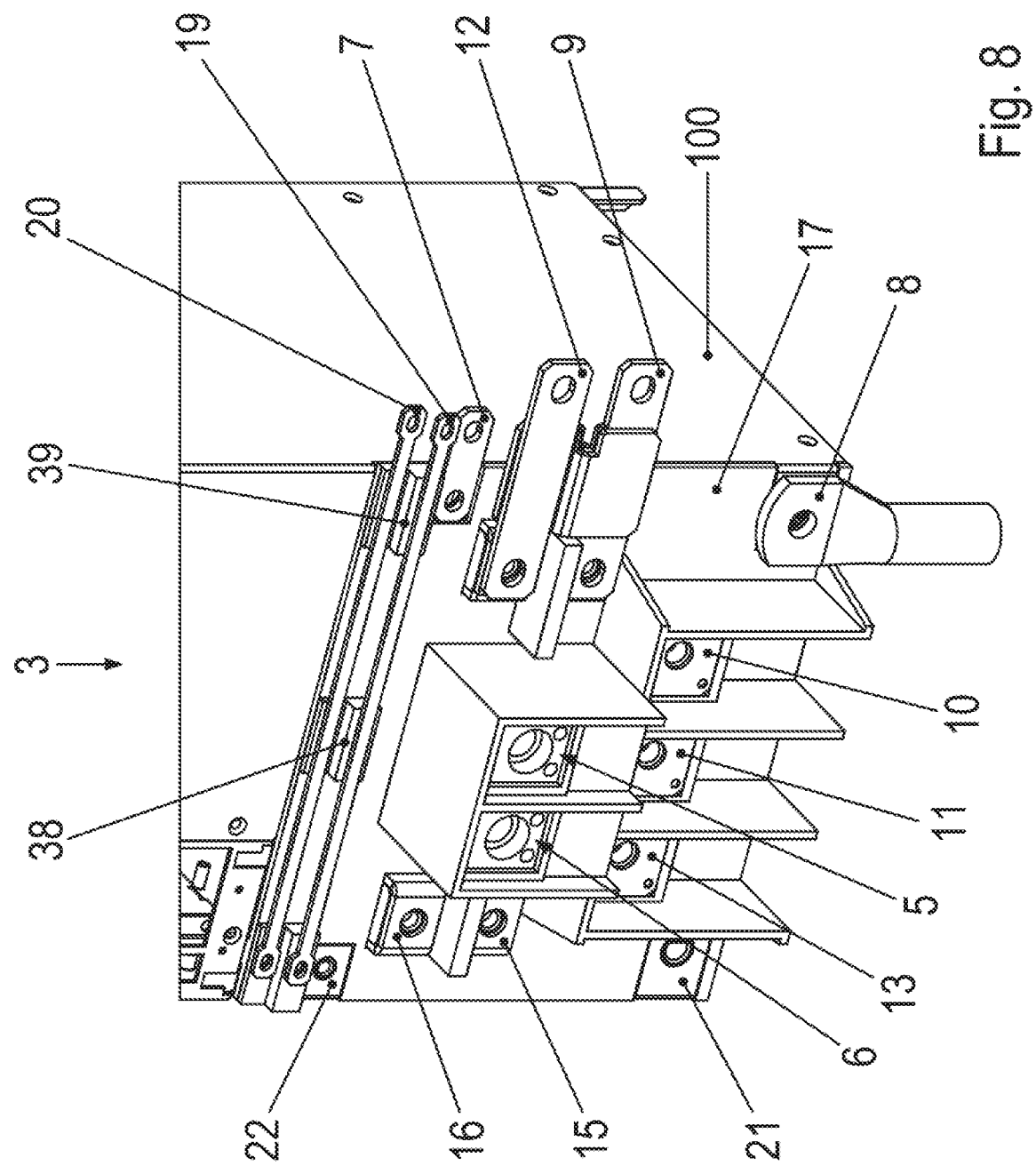
FIG. 8 shows a drive module of the converter system in a perspective view with a connection device according to an example embodiment of the present invention.
Figure 9:
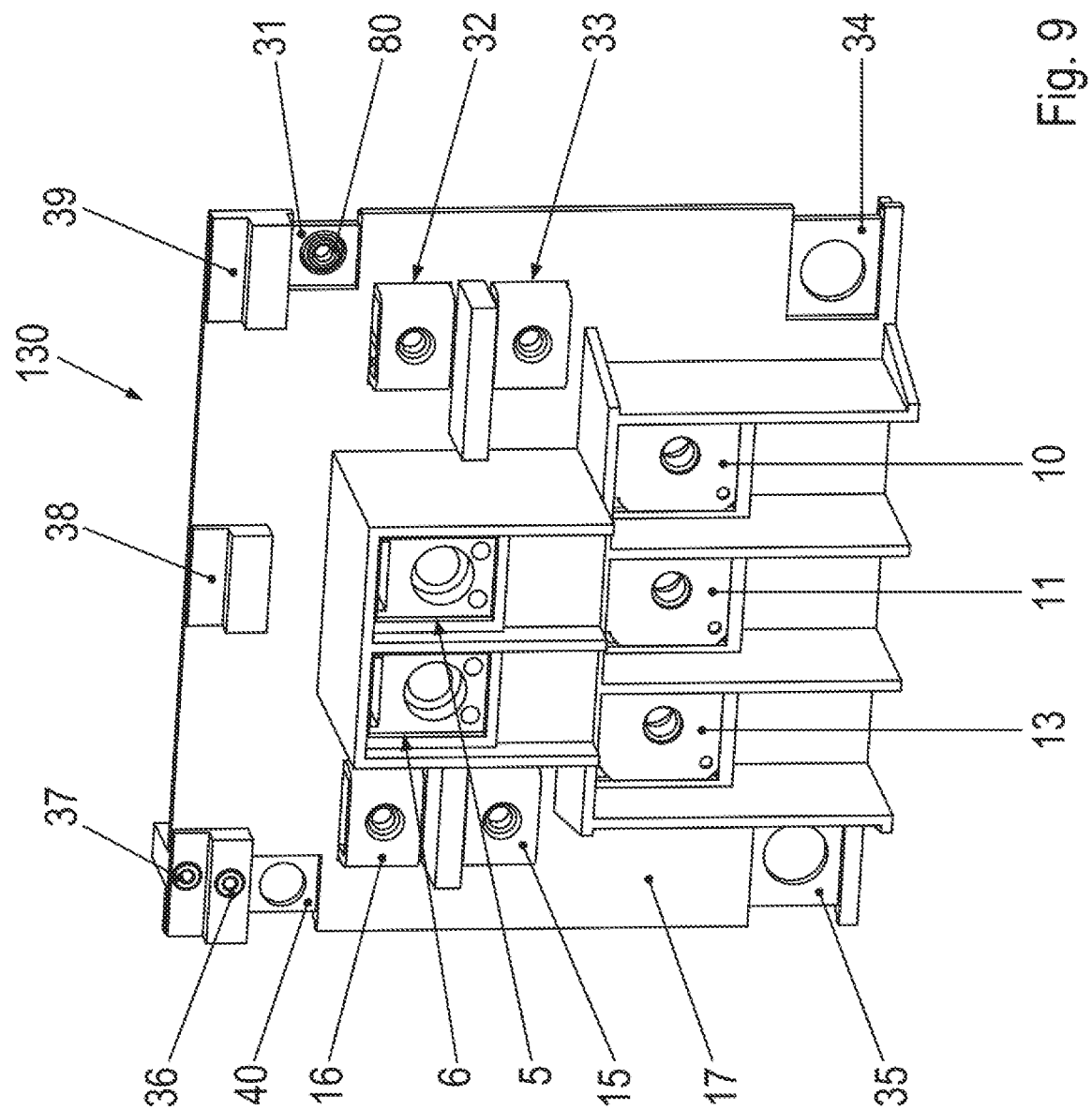
FIG. 9 shows the connection unit in a perspective view.
Figure 10:
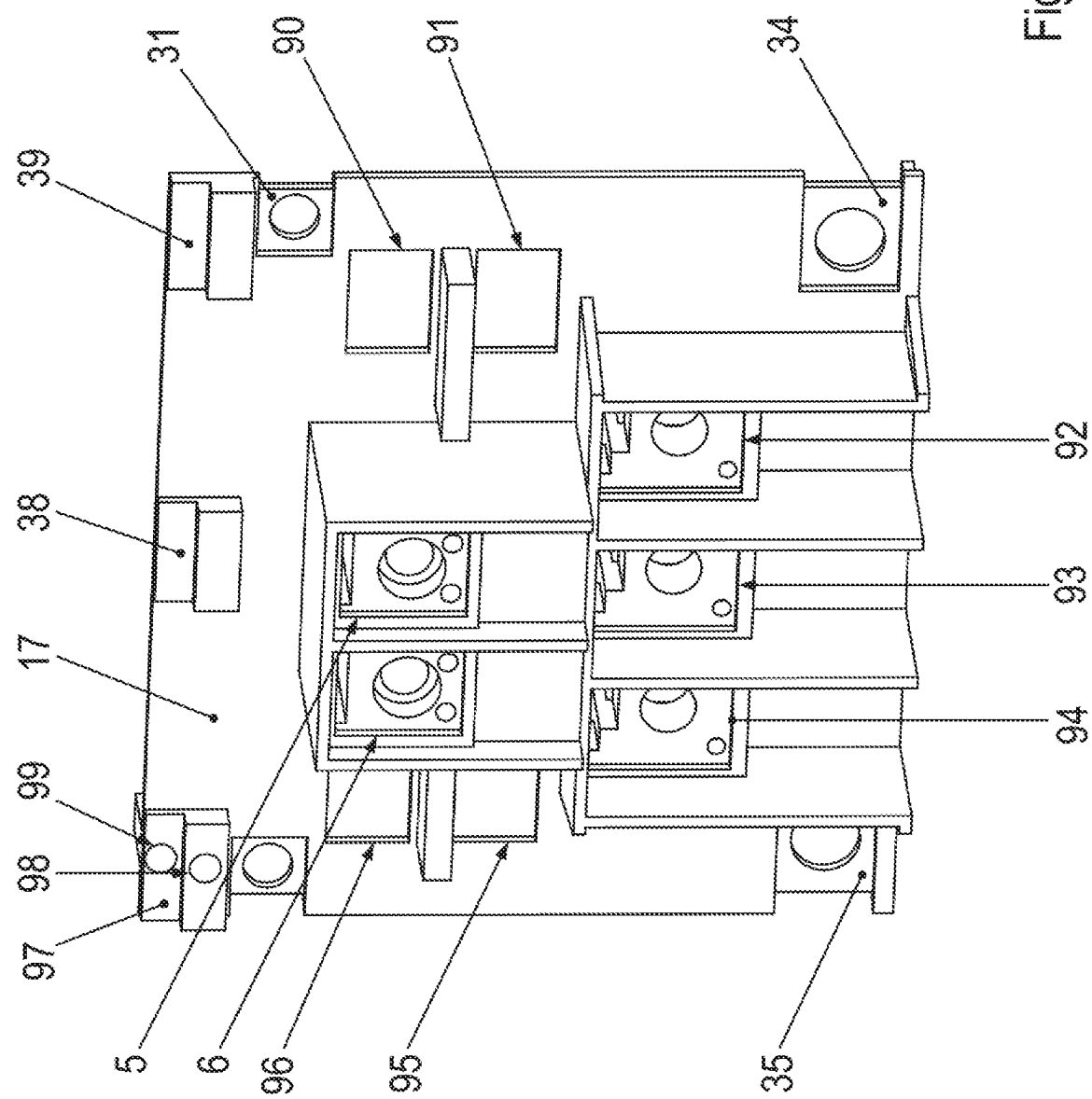
In FIG. 10, a receiving part of the connection unit is illustrated in a perspective view.
Figure 11:
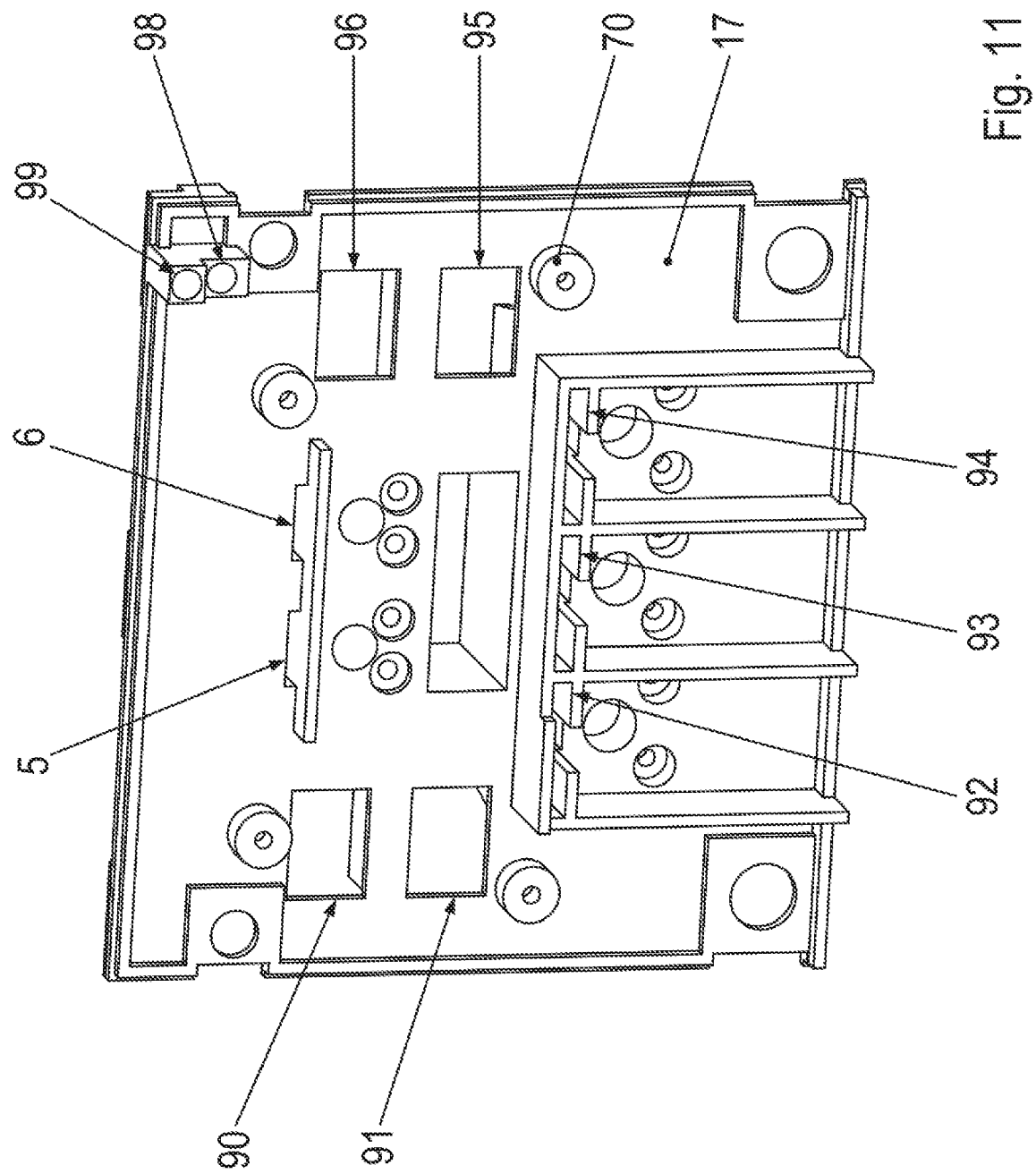
FIG. 11 shows the backside of the receiving part in a perspective view.
Figure 12:
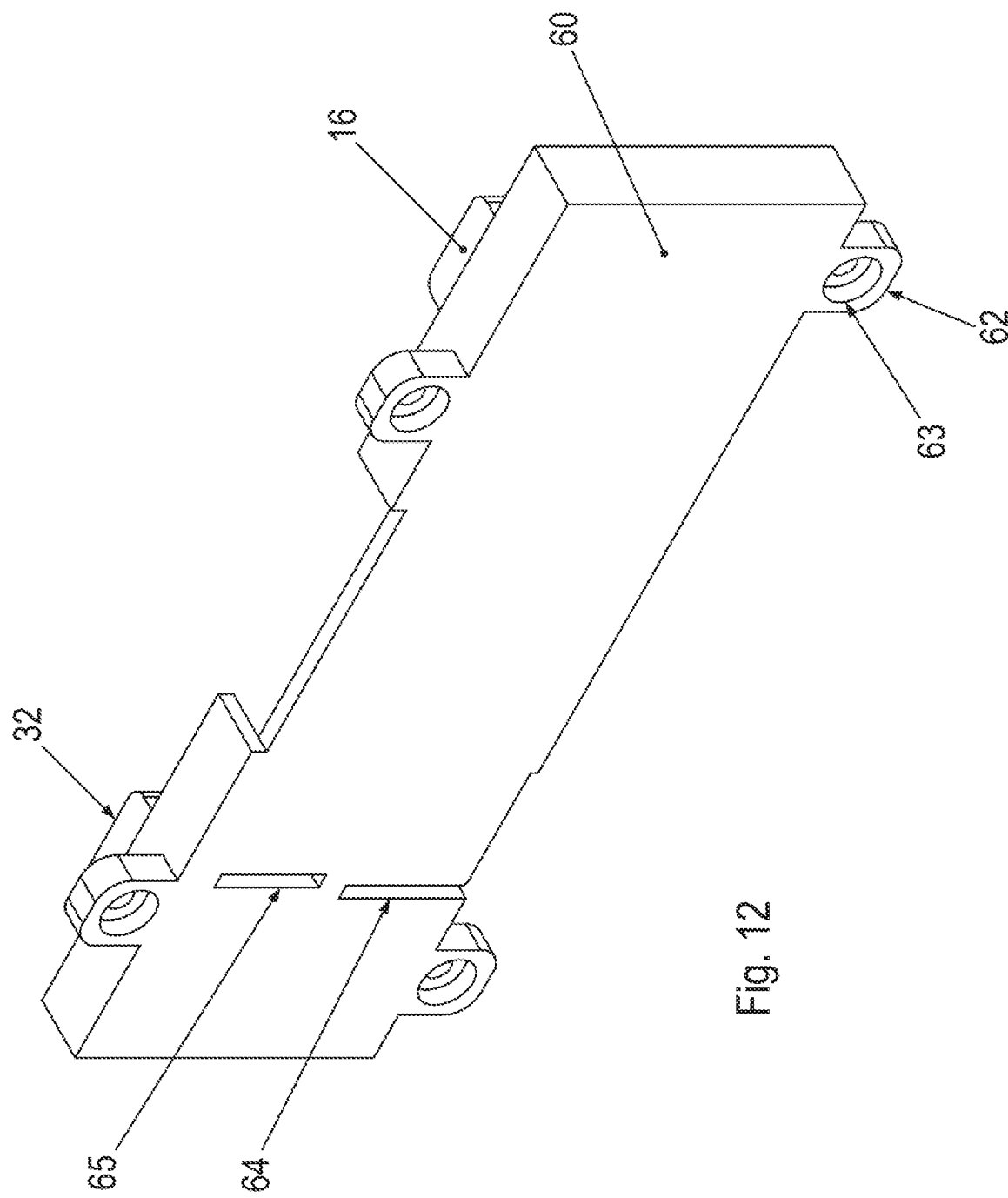
FIG. 12 shows the cover part in a perspective view.
Figure 13:
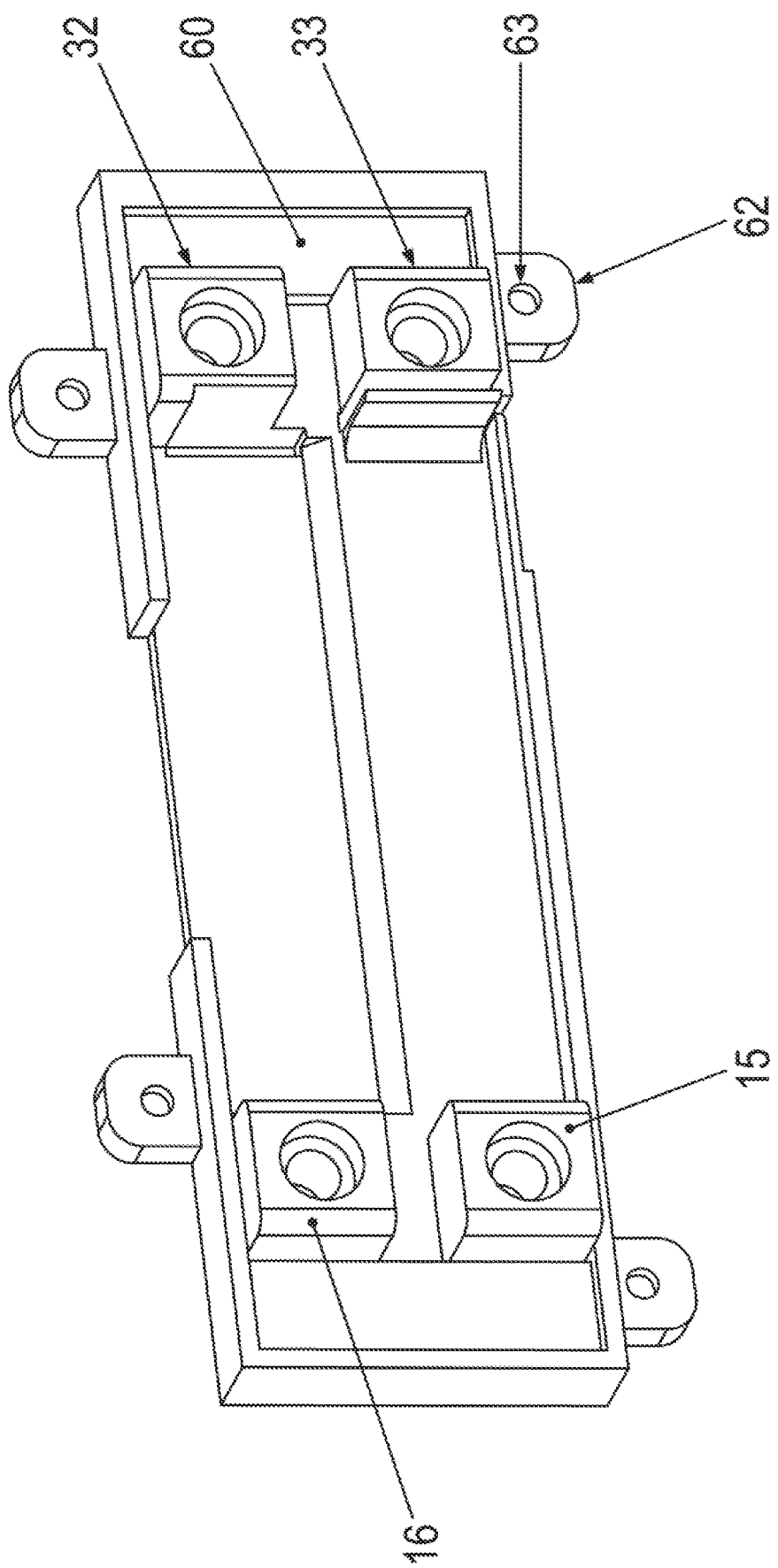
FIG. 13 shows a perspective view of the side of the cover part that faces the receiving part and in which two bus bars of the connection unit are disposed.

FIGS. 8 and 9 show connection unit 130, which may be used for a drive module. The connection unit 130 substantially corresponds to the connection unit 30 and has a similar receiving part 17. The lug parts (14, 18) for the brake module are not fitted with components.

In the configuration of the module as a drive module (2, 3, 4), the module includes an inverter. The inverter is supplied from the voltage-intermediate circuit and converts the injected direct-current voltage into a three-phase alternating voltage.

Connection unit 130 of the drive module (2, 3, 4), in particular second connection unit 130, also has bus bars (15, 16) for connecting the input of the inverter to the voltage-intermediate circuit, in particular to the output of the rectifier of supply module 1. For this purpose, the bus bars (15, 16) of connection unit 130 of the drive module (2, 3, 4) are connected to the bus bars (15, 16) of connection unit 30 of supply module 1 in an electrically conductive manner with the aid of connector bars (9, 12). The connector bars (9, 12) are, for example, connected to the respective bus bars (15, 16) in a reversible manner.

The connector bars (9, 12) overlap one another at least partially, and an insulating device is disposed between the connector bars.

In contrast to supply module 1, the drive module (2, 3, 4) has no brake resistance. Connection unit 130 of the drive module (2, 3, 4), in particular second connection unit 130, has no lug parts (14, 18) for connecting a brake resistance. The receiving sections (14, 18) for the lug parts (14, 18) are arranged to remain empty in the drive module (2, 3, 4).

With the aid of the first, second and third lug parts (10, 11, 13), a three-phase rotating current generated by the inverter is able to be fed into an electric motor. First lug part 10 is used for the first phase, second lug part 11 is used for the second phase, and third lug part 13 is used for the third phase of the three-phase current.

Figure 14:
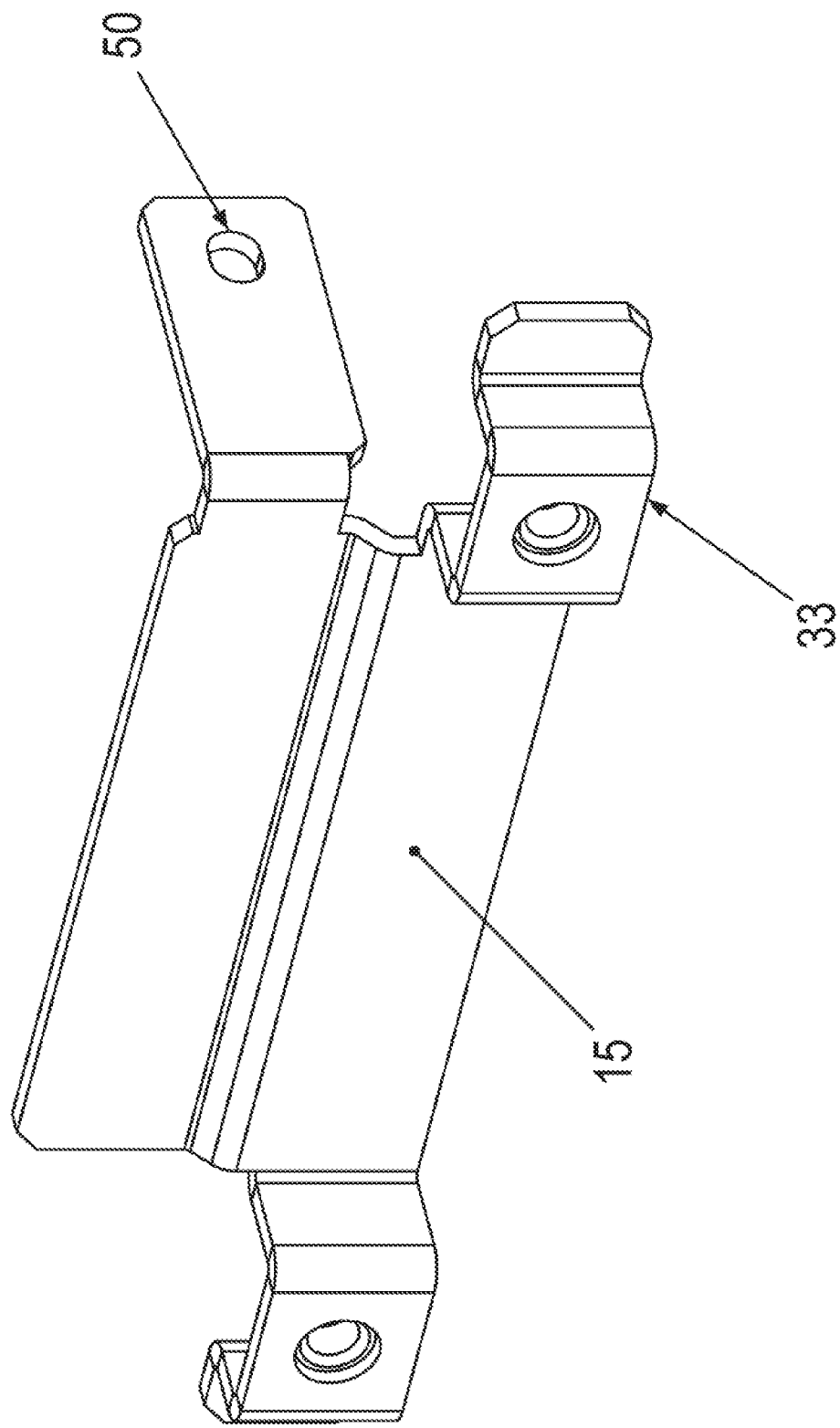
In FIG. 14, a first bus bar is shown in a perspective view.
Figure 15:
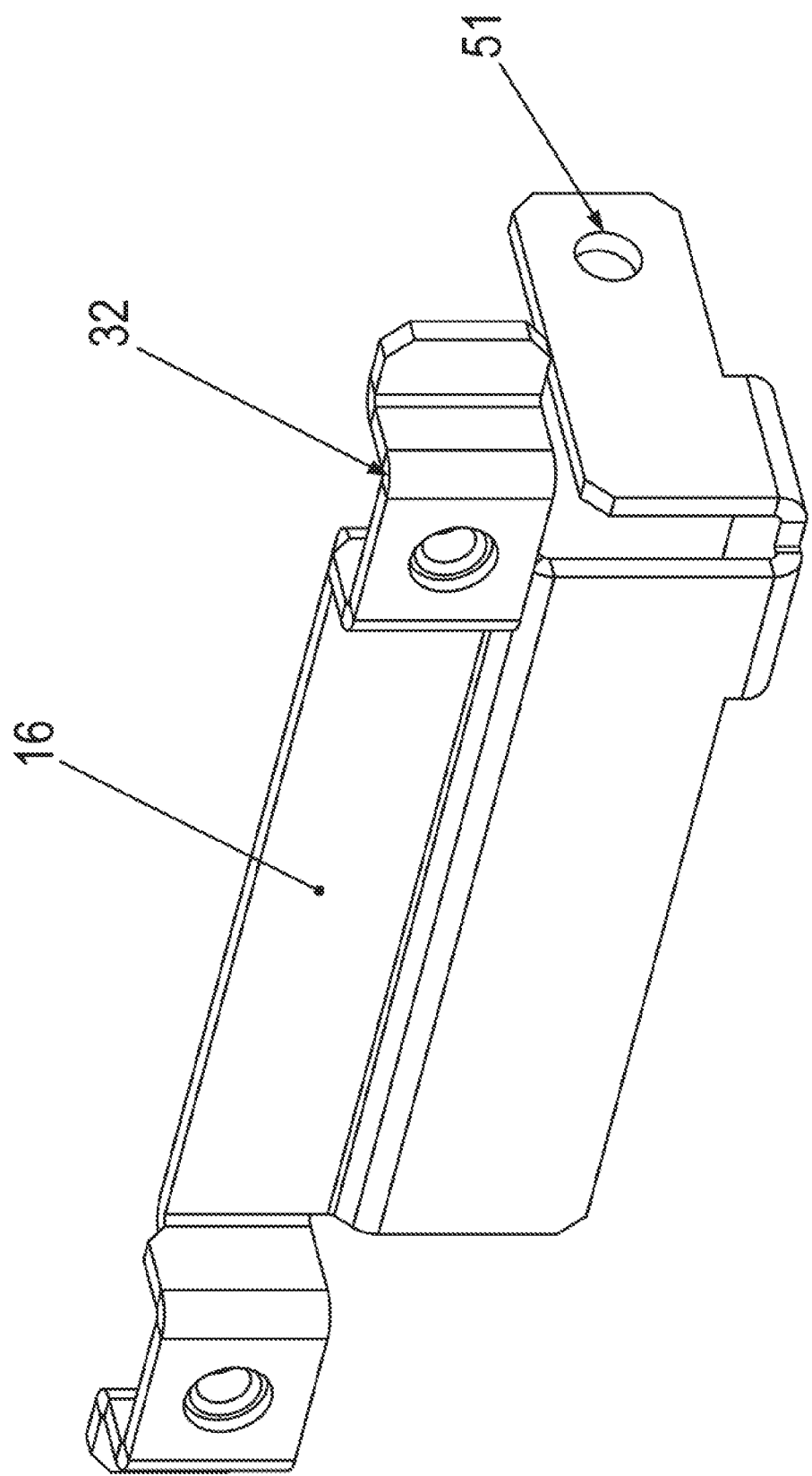
FIG. 15 shows a second bus bar in a perspective view.

FIGS. 14 and 15 show the bus bars (15, 16) in detail. The bus bars (15, 16) are arranged as punched and bent parts and in each case have two regions, in particular lug sections (32, 33), which are bent to project toward the topside and into a recess (90, 91, 95, 96), in particular an uninterrupted recess (90, 91, 95, 96) in receiving part 17, and thus project from the topside of receiving part 17. These regions in turn have a recess, in particular a threaded bore, by which a screw part that presses a cable socket against the respective bus bar (15, 16) is able to be connected by screws.

The bus bar (15, 16) has a broadened section situated between the lug sections (32, 33) from which a connection section including a recess (50, 51) projects into the housing of the module in order to connect the bus bar (15, 16) to the electronics of the module, in particular to the output connection of the rectifier of supply module 1 or to an input connection of the inverter of a drive module (2, 3, 4).

The lug parts (10, 11, 13, 14, 18) are shown in detail in FIGS. 16 and 17. Each one of these lug parts (10, 11, 13, 14, 18) is arranged as an angle sheet and is bent in an L-shape. The lug parts are, for example, arranged as punched and bent parts.

The bent lug section of the respective lug part (10, 11, 13, 14, 18) is slipped into a recess in the respective receiving section (5, 6, 92, 93, 94) that passes through receiving part 17. Each lug part (10, 11, 13, 14, 18) is connected to receiving part 17 with the aid of screws. The lug parts (10, 11, 13, 14, 18) are thus connected to respective receiving part 17 in a form-locking and reversible manner.

Figure 19:
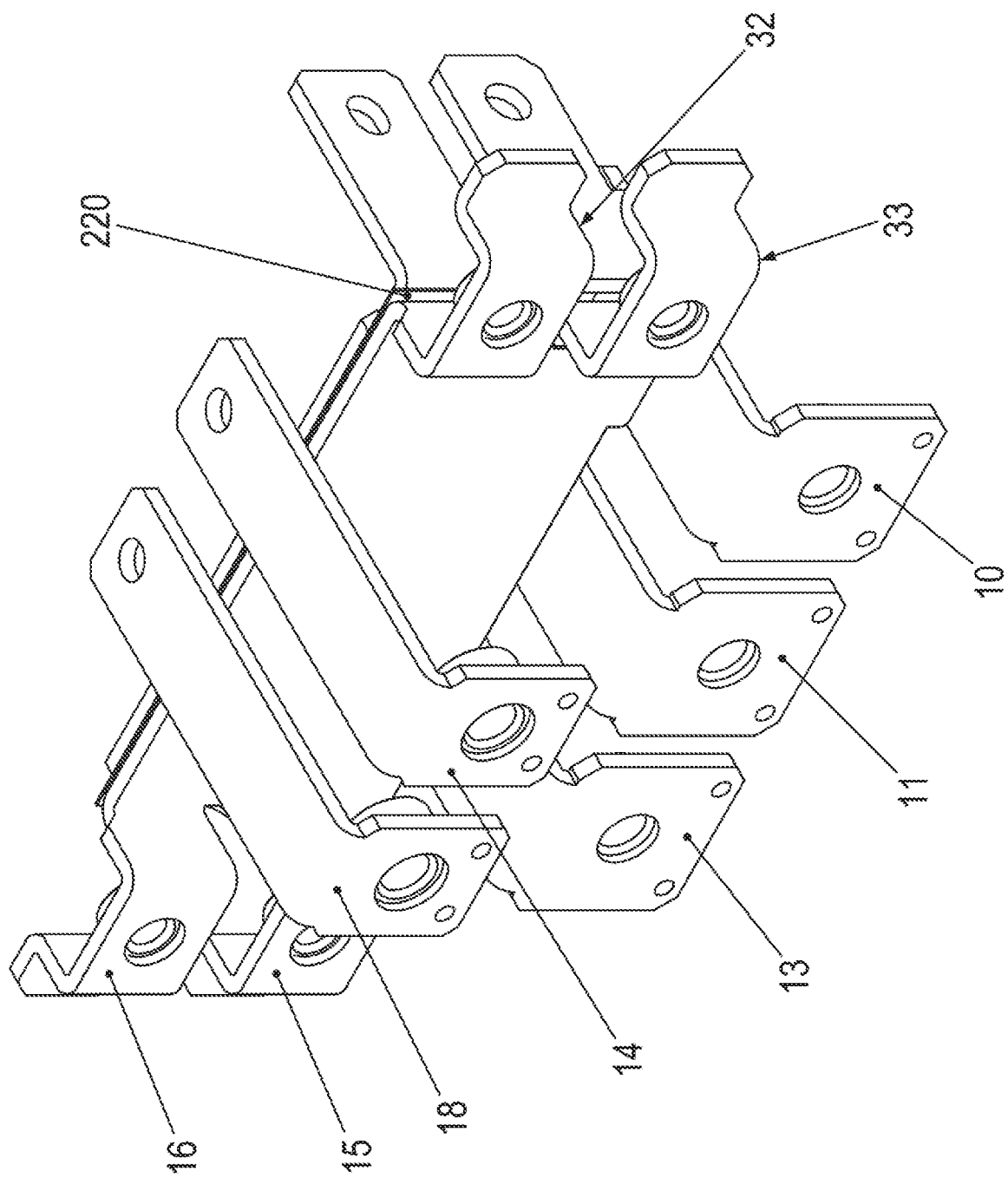
FIG. 19 shows the placement of the bus bars, lug parts, and the insulating device in a perspective view, without the receiving part.
Figure 20:
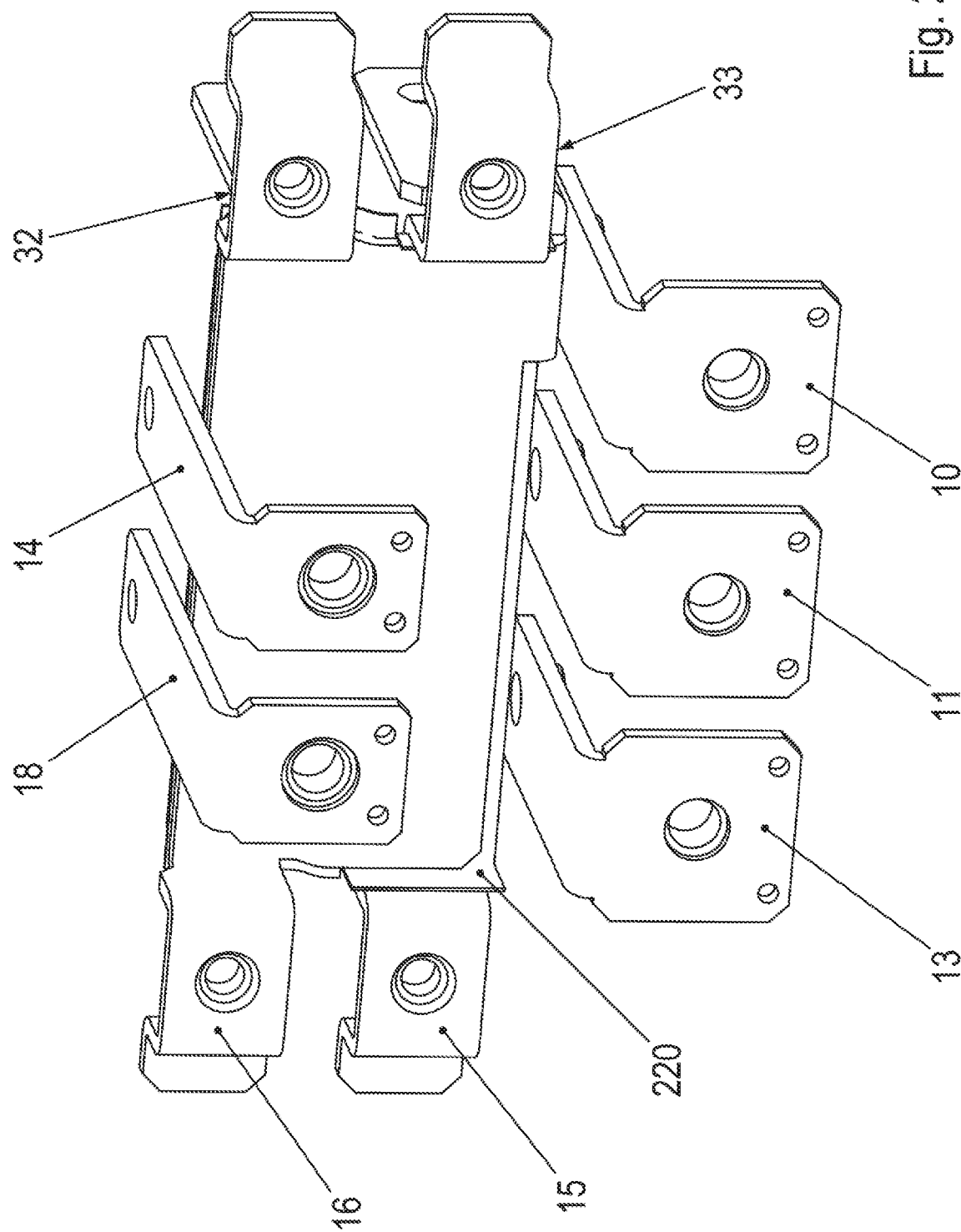
FIG. 20 shows the placement of the bus bars, lug parts, and the insulating device in a further oblique view, without the receiving part.

FIGS. 19 and 20 show the placement of the bus bars (15, 16) and lug parts (10, 11, 13, 14, 18), receiving part 17 being hidden. The broadened sections of the bus bars (15, 16) overlap one another. An insulating device 220, in particular insulating foil, by which first bus bar 15 is able to be electrically insulated from second bus bar 16, is disposed between the bus bars (15, 16). Both bus bars (15, 16) touch insulating device 220. Preferably, insulating means 220 is developed to be elastically deformable so that the shape of insulating device 220 is adaptable to the boundary surface between first bus bar 15 and second bus bar 16.

The bus bars (15, 16) extend substantially parallel to one another. The lug parts (10, 11, 13, 14, 18) extend substantially parallel to one another through receiving part 17 and into the module. The extension direction of the bus bars (15, 16) is situated transversely to the extension direction of the lug parts (10, 11, 13, 14, 18).

Figure 18:
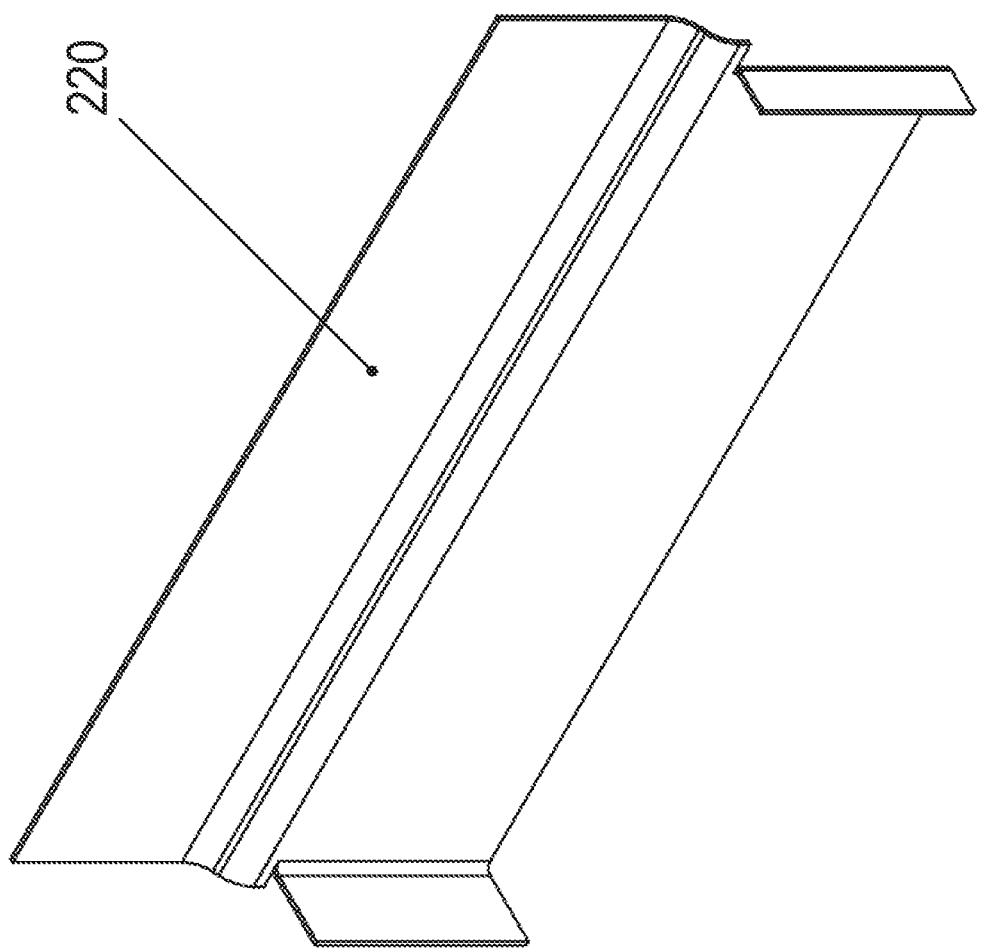
FIG. 18 shows an insulating device of the connection unit in a perspective view.

FIG. 18 shows insulating device 220 in detail. Insulating device 220 is, for example, arranged to be elastically deformable so that the shape of insulating device 220 at the boundary surface between first bus bar 15 and second bus bar 16 is adaptable.

The connection unit (30, 130) may be used for different electrical devices of an electrical device system. Depending on the type of electrical device, no corresponding connection devices, in particular lug parts (10, 11, 13, 14, 18), are fitted.

The connection unit (30, 130) is at least partially surrounded, in the form of a housing, by a further housing part. The further housing part may be arranged to be electrically insulating.

LIST OF REFERENCE NUMERALS

1 supply module
2 drive module
3 drive module
4 drive module
5 receiving section, in particular for fourth lug part
6 receiving section, in particular for fifth lug part
7 connection part, in particular ground-connection part
8 cable socket
9 second connector bar
10 first lug part, in particular bus-bar lug part for the first phase
11 second lug part, in particular bus-bar lug part for the second phase
12 first connector bar
13 third lug part, in particular bus-bar lug part for the third phase
14 fourth lug part, in particular bus-bar lug part for brake resistance
15 first bus bar
16 second bus bar
17 receiving part
18 fifth lug part, in particular bus-bar lug part for brake resistance
19 connection part, in particular for the low-voltage supply
20 connection part, in particular for the low-voltage supply
21 housing-part section
22 housing-part section
30 connection unit
31 receiving section, in particular for the housing-part section
32 lug section
33 lug section
34 receiving section, in particular for the housing-part section
35 receiving section, in particular for the housing-part section
36 bushing
37 bushing
38 support section
39 support section
40 receiving section, in particular for the housing-part section
50 recess
51 recess
60 cover part
61 screw part
62 lug
63 recess
64 recess
65 recess
70 projection
80 bushing
90 receiving section
91 receiving section
92 receiving section
93 receiving section
94 receiving section
95 receiving section
96 receiving section
97 support section
98 recess
99 recess
100 housing part
130 connection unit
200 recess
201 recess
210 recess
211 recess
220 insulating device, in particular insulating foil

The invention claimed is:

1. A connection unit for an electrical device, comprising:
an electrically insulating receiving part including at least one first receiving section, at least one second receiving section, and at least one electrically conductive connection device, the receiving part adapted to accommodate a connection device with the aid of the first and second receiving sections;

wherein a connection device is accommodated in the first receiving section, and no connection device is accommodated in the second receiving section.

2. The connection unit according to claim 1, wherein the connection device includes a bus bar.

3. The connection unit according to claim 1, wherein the first receiving sections are set apart from one another, the second receiving sections, are set apart from one another, the first receiving sections and the second receiving sections are set apart from one another, and the connection devices are set apart and electrically insulated from one another with the aid of the receiving part.

4. The connection unit according to claim 1, wherein the connection device is connected to the receiving part in a reversible manner, by form locking, and/or by force locking, the connection device being connected to the receiving part with the aid of a screw part.

5. The connection unit according to claim 1, wherein the connection device connects a cable socket and/or a connector bar to an electrical connection element, a voltage input, and/or a voltage output of the electrical device in an electrically conductive manner, the connection device including a threaded bore by which a screw part is screw-fittable for a reversible electrically conductive connection of the cable socket and/or a connector bar to the connection device.

6. The connection unit according to claim 1, further comprising a bushing connected and/or extrusion-coated to the receiving part by form-locking, the bushing being formed of an electrically conductive material.

7. The connection unit according to claim 1, wherein the connection unit includes two connection devices and an insulating device disposed between the two connection devices, the connection devices touching the insulating device, the connection device being accommodated in the receiving part, the connection devices being electrically insulated from one another with the aid of the insulating device.

8. The connection unit according to claim 1, wherein (a) the receiving part is arranged as a plastic part and/or a plastic injection-molded part, (b) the receiving sections are arranged as recesses in the receiving part, and/or (c) the connection device is arranged as a sheet-metal part and/or as a punched and bent part.

9. The connection unit according to claim 2, further comprising a cover part reversibly connected to and/or screw fitted with the aid of a screw part to the receiving part, the bus bar being delimited by the cover part and the receiving part.

10. The connection unit according to claim 9, wherein (a) the bus bar is at least partially disposed between the cover part and the receiving part, (b) the bus bar is held by the cover part and the receiving part, and/or (c) the cover part includes a recess through which the bus bar is at least partially guided.

11. An electrical device system, comprising:
a first electrical device;
a second electrical device;
at least one connector bars;
a first connection unit as recited in claim 1; and
a second connection unit as recited in claim 1;
wherein the first electrical device is reversibly connected to the first connection unit;

wherein the second electrical device is reversibly connected to the second connection unit;

wherein a voltage output of the first electrical device is connected in an electrically conductive manner to a voltage input of the second electrical device with the aid of the first and second connection units and the connector bar, the first connection unit including a first receiving part, the second connection unit including a second receiving part;

wherein each of the first and the second receiving parts includes a first receiving section and a second receiving section adapted to accommodate and to reversibly connect to a connection device;

wherein a connection device is accommodated in the second receiving section of the first connection unit and no connection device is accommodated in the second receiving section of the second connection unit; and wherein the first and the second receiving parts are of the same type.

12. The electrical device system according to claim 11, wherein the first electrical device is screw-connected to the first connection unit with the aid of a screw part, and/or the second electrical device is screw-connected to the second connection unit with the aid of a screw connection.

13. The electrical device system according to claim 11, wherein the connection device includes a bus bar.

14. The electrical device system according to claim 11, wherein the first and second receiving parts are identical to each other.

15. The electrical device system according to claim 11, wherein the first electrical device is arranged as a supply module and includes a rectifier, the second electrical device is arranged as a drive module and includes an inverter, a voltage output of the rectifier and/or an intermediate-circuit voltage connection is connected in an electrically conductive manner to two respective connection devices of the first connection unit, and a voltage input of the inverter and/or an intermediate-circuit voltage connection is connected in an electrically conductive manner to two respective connection devices of the second connection unit, a respective connection device of the first connection unit is connected to a respective connection device of the second connection unit with the aid of a connector bar, the electrical device system including two connector bars and an insulating device that is arranged between the two connector bars, each connector bar touching the insulating device and/or being arranged so as to be electrically insulated from one another with the aid of the insulating device.

16. The electrical device system according to claim 15, wherein the first connection unit includes three connection devices, and each phase of a three-phase current supply is connected to a respective voltage input of the supply module with the aid of a respective connection device.

17. The electrical device system according to claim 16, wherein each connection device is arranged as a lug part.

18. The electrical device system according to claim 15, wherein the second connection unit includes three connection device, and each phase of a three-phase alternating voltage generated by the inverter is connected to a respective voltage input of a machine and/or an electric motor with the aid of a respective connection device.

19. The electrical device system according to claim 18, wherein each connection device is arranged as a lug part.

20. The electrical device system according to claim 15, wherein the receiving part includes two second receiving sections for two connection devices, and connection devices are accommodated in the second receiving sections of the second receiving part for an electrically conductive connection to a brake resistance of the supply module.

21. The electrical device system according to claim 15, further comprising at least one connection part connecting the supply module and/or the drive module to a low-voltage supply in an electrically conductive manner with the aid of bushings intermaterially connected to the respective receiving part, and/or wherein respective low-voltage inputs of the supply module and the drive module are connected to one another in an electrically conductive manner with the aid of the bushings and the connection part.

22. A method for producing two variants of a connection unit for electrical devices from a modular set that includes a receiving part, a cover part having two recesses, two bus bars, an insulating device, and at least one lug part, the receiving part having a first receiving section and a second receiving section for lug parts, and receiving sections for the bus bars, for production of a first variant of the connection unit, the method including:
  (a) placing the insulating device between the bus bars so that the bus bars are electrically insulated from one another and a preassembled unit is formed from the bus bars and the insulating device;
  (b) inserting the preassembled unit into the cover part and guiding a respective lug section of a bus bar of the unit through a respective recess;
  (c) reversibly connecting and/or screw-connecting with the aid of a screw part the cover part to the receiving part; and
  (d) inserting the lug part into the first receiving section and connecting the lug part to the receiving part in a force-locking manner, a form-locking manner, and/or a screw-connected manner with the aid of a screw part; and for production of a second variant of the connection unit, the method including, in addition to steps (a) to (d), inserting a further lug part into the second receiving section and connecting the further lug part to the receiving part in a force-locking manner, a form-locking manner, and/or a screw-connected manner with the aid of a screw part.

23. The method according to claim 22, wherein a connection device is accommodated in the first receiving section of the first variant, and no connection device is accommodated in the second receiving section of the first variant.

\* \* \* \* \*